United States Patent
Ikeda et al.

(10) Patent No.: US 8,872,451 B2
(45) Date of Patent: Oct. 28, 2014

(54) MOTOR DEVICE AND POWER TOOL

(75) Inventors: Masaki Ikeda, Shiga (JP); Norihiro Iwamura, Shiga (JP)

(73) Assignee: Panasonic Corporation, Osaka (JP)

( * ) Notice: Subject to any disclaimer, the term of this patent is extended or adjusted under 35 U.S.C. 154(b) by 160 days.

(21) Appl. No.: 13/643,106

(22) PCT Filed: Apr. 8, 2011

(86) PCT No.: PCT/JP2011/058932
§ 371 (c)(1),
(2), (4) Date: Oct. 24, 2012

(87) PCT Pub. No.: WO2011/136004
PCT Pub. Date: Nov. 3, 2011

(65) Prior Publication Data
US 2013/0038253 A1    Feb. 14, 2013

(30) Foreign Application Priority Data
Apr. 28, 2010 (JP) ................ 2010-103676

(51) Int. Cl.
*H02P 29/00* (2006.01)
*G01R 19/165* (2006.01)
*H02P 29/02* (2006.01)
*H02J 7/00* (2006.01)

(52) U.S. Cl.
CPC ..... *G01R 19/16542* (2013.01); *H02J 2007/004* (2013.01); *H02P 29/021* (2013.01)
USPC .............. 318/139; 318/34; 318/558

(58) Field of Classification Search
CPC ............ G01R 19/16542; Y02T 10/7005
USPC .......................... 318/139, 34, 558
See application file for complete search history.

(56) References Cited

U.S. PATENT DOCUMENTS

| | | | | |
|---|---|---|---|---|
| 6,388,426 B1 * | 5/2002 | Yokoo et al. | ................ | 320/136 |
| 6,448,731 B1 * | 9/2002 | Miller et al. | ................ | 318/488 |
| 7,492,124 B2 * | 2/2009 | Johnson et al. | ............... | 320/107 |

FOREIGN PATENT DOCUMENTS

| | | |
|---|---|---|
| JP | 10-027630 A | 1/1998 |
| JP | 2001-095158 A | 4/2001 |
| JP | 2009-089468 A | 4/2009 |
| JP | 2009-126642 A | 6/2009 |

OTHER PUBLICATIONS

International Preliminary Report on Patentability for corresponding International Application No. PCT/JP2011/058932 dated Dec. 12, 2012 (English translation).
International Search Report for corresponding International Application No. PCT/JP2011/058932 mailed Jul. 12, 2011.

* cited by examiner

*Primary Examiner* — David S Luo
(74) *Attorney, Agent, or Firm* — Renner, Otto, Boisselle & Sklar, LLP

(57) ABSTRACT

A motor device includes an electric motor operated when supplied with power from a rechargeable battery, a voltage detection unit that detects voltage of the rechargeable battery, a determination unit that performs an abnormality determination based on a comparison of the voltage of the rechargeable battery, which is detected by the voltage detection unit, and a determination value, a control unit that controls the operation of the electric motor in accordance with the determination result of the determination unit, and a temperature detection unit that detects the usage environment temperature. The determination unit changes the determination value in accordance with the temperature detected by the temperature detection unit and performs the abnormality determination based on the changed determination value.

8 Claims, 3 Drawing Sheets

MOTOR DEVICE AND POWER TOOL

FIELD

The present invention relates to a motor device for a power tool or the like that uses a rechargeable battery as a drive power supply for an electric motor.

BACKGROUND ART

A power tool or the like proposed in the prior art is driven by an electric motor supplied with power from a rechargeable battery and includes, in regard to protection of the rechargeable battery, a means for detecting the voltage of a battery cell of the rechargeable battery and a means for determining an abnormality (over-discharge) when the voltage value becomes less than a determination value and controlling the supply of power to the motor, that is, stopping the operation of the power tool (for example, refer to patent document 1).

Patent Document 1: Japanese Laid-Open Patent Publication No. 10-27630

SUMMARY OF THE INVENTION

When the discharge current increases, the decrease amount in the voltage of the rechargeable battery also increases. Generally, the voltage decrease amount is determined by the product of an internal resistor or wire resistor and the discharge current. However, temperature affects and varies the resistance. Accordingly, even when the same discharge current is used for an operation, the voltage decrease amount that occurs in the rechargeable battery varies in accordance with changes in the resistance of an internal resistor or the like resulting from changes in the temperature of the usage environment. Even when the power tool may be operated under normal temperatures, depending on the present usage environment temperature, the supply of power to the motor may be stopped, that is, the control for stopping the operation of the power tool may be implemented at an early stage. This narrows the operable range of the power tool.

Accordingly, it is an object of the present invention to provide a motor device and a power tool that stabilizes and ensures the operable range even when the usage environment temperature changes.

One aspect of the present invention is a motor device including an electric motor operated when supplied with power from a rechargeable battery. A voltage detection unit detects voltage of the rechargeable battery. A determination unit performs an abnormality determination based on a comparison of the voltage of the rechargeable battery, which is detected by the voltage detection unit, and a determination value. A control unit controls the operation of the electric motor in accordance with the determination result of the determination unit. A temperature detection unit detects the usage environment temperature. The determination unit changes the determination value in accordance with the temperature detected by the temperature detection unit and performs the abnormality determination based on the changed determination value. As a result, even when the usage environment temperature changes, the operable range of the motor device can be maintained in a preferred manner.

DESCRIPTION OF THE EMBODIMENTS

One embodiment of the present invention will now be described with reference to the drawings.

Figure 1:
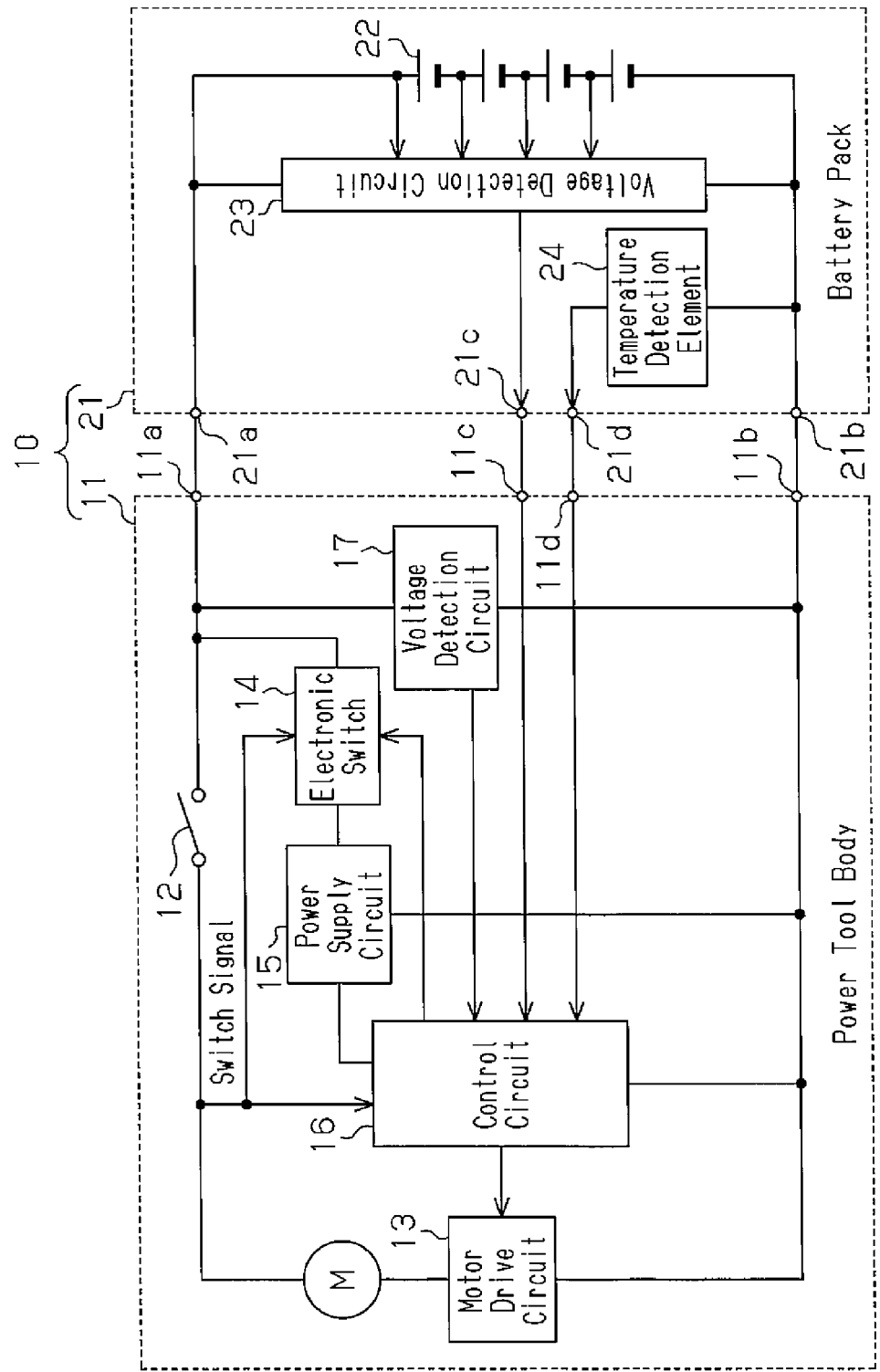
FIG. 1 is an electric diagram of a power tool in one embodiment.

FIG. 1 shows a power tool 10 serving as a motor device in the present embodiment. The power tool 10 is, for example, a drill driver or a disk grinder, and includes a power tool body 11, which uses an electric motor M as a drive source, and a battery pack 21, which is attached in a removable manner to the power tool body 11.

The power tool body 11 includes power terminals 11a and 11b, which are supplied with power from the battery pack 21, and signal terminals 11c and 11d, which receive various detection signals from the battery pack 21. The electric motor M includes a positive terminal, which is connected via an operation switch 12 to the power terminal 11a, and a negative terminal, which is connected via a motor drive circuit 13 to the power terminal 11b. An electronic switch 14, such as a transistor, and a power supply circuit 15 are connected in parallel to the operation switch 12. The control circuit 16 includes a positive terminal, which is connected via the power supply circuit 15 and the electronic switch 14 to the power terminal 11a, and a negative terminal, which is connected to the power terminal 11b.

When the operation switch 12 is activated, power is supplied from the battery pack 21 via the power terminals 11a and 11b to the motor M. The activation of the operation switch 12 sends a switch signal to the control circuit 16 and the electronic switch 14. The switch signal activates the electronic switch 14. When the electronic switch 14 is activated, power is supplied from the battery pack 21 to the power supply circuit 15, which supplies operation power for the control circuit 16. The control circuit 16 becomes operational when supplied with operational power from the power supply circuit 15 and controls rotation produced by the motor M with the motor drive circuit 13. Even when the operation switch 12 is deactivated, the control circuit 16 may control the electronic switch 14 to perform a timer operation so that the supply of operational power is continued for a predetermined time.

A voltage detection circuit 17 is arranged between the power terminals 11a and 11b to detect the voltage between the terminals, namely, the voltage of the battery pack 21 (rechargeable battery 22) at the body 11. The voltage detection circuit 17 is one example of a voltage detection unit. The voltage value (detected voltage) detected by the voltage detection circuit 17 is provided as a voltage detection signal to the control circuit 16. The control circuit 16 is provided with a voltage detection signal from a voltage detection circuit 23 in the battery pack 21 and a temperature detection signal from a temperature detection element 24 in the battery pack 21 via signal terminals 11c and 11d. The voltage detection circuit 23 is one example of a voltage detection unit.

The battery pack 21 is attached in a removable manner to the power tool body 11 and includes power terminals 21a and 21b and signal terminals 21c and 21d respectively corresponding to the power terminals 11a and 11b and signal terminals 11c and 11d of the power tool body 11. When the battery pack 21 is attached to the power tool body 11, the terminals 11a to 11d are electrically connected to the terminals 21a to 21d, respectively. This allows for the power tool body 11 to be supplied with power and provided with various types of detection signals. The battery pack 21 is also attached in a removable manner to a charger (not shown) and charged by the charger.

The battery pack 21 accommodates the rechargeable battery 22, which is formed by a plurality of battery cells, such as lithium ion batteries. The rechargeable battery 22 includes a positive terminal, which is connected to the power terminal 21a, and a negative terminal, which is connected to the power terminal 21b. The voltage detection circuit 23 of the battery pack 21 is operated when supplied with power from the rechargeable battery 22, detects the voltage value of each battery cell in the rechargeable battery 22, and detects the total voltage (voltage at the two terminals) of the rechargeable battery 22. The voltage value detected by the voltage detection circuit 23 is provided as a voltage detection signal via the terminals 21c and 11c to the control circuit 16 of the power tool body 11.

The battery pack 21 includes the temperature detection element 24, which is a thermistor or the like. The temperature detection element 24 detects the usage environment temperature in the battery pack 21. The temperature detected by the temperature detection element 24 is provided as a temperature detection signal via the terminals 21d and 11d to the control circuit 16 of the power tool body 11.

The control circuit 16 recognizes the voltage of the rechargeable battery 22 based on the voltage detection signals from the voltage detection circuits 17 and 23. During use of the power tool 10 (operation of the motor M), the control circuit 16 detects an over-discharge abnormality in the rechargeable battery 22 from the detected voltage value of the rechargeable battery 22. When determining that an over-discharge abnormality is occurring in the rechargeable battery 22, the motor drive circuit 13 stops supplying power to the electric motor M from the rechargeable battery 22. In this manner, the operation of the power tool 10 is automatically stopped when the rechargeable battery 22 includes an over-discharge abnormality. Further, the control circuit 16 recognizes the usage environment temperature based on the temperature detection signal from the temperature detection element 24 and switches the control process in accordance with the usage environment temperature. The control circuit 16 is one example of a determination unit and a control unit.

Figure 2:
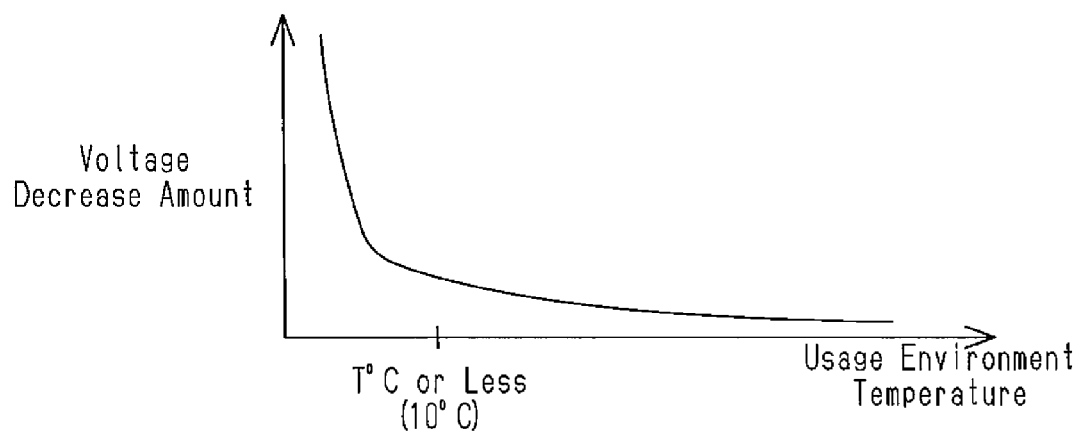
FIG. 2 is a chart illustrating the relationship of the usage environment temperature and a voltage decrease amount of the rechargeable battery.

FIG. 2 shows the voltage decrease amount of the rechargeable battery 22 (change in the resistance of an internal resistor or the like) with respect to changes in the usage environment temperature. As shown in FIG. 2, when the usage environment temperature is higher than T° C. (e.g., 10° C.), the resistance of the internal resistor in the rechargeable battery 22 is small, and the voltage decrease amount is small. However, when the usage environment temperature is in a low temperature range that is less than or equal to T° C., as the temperature decreases, the resistance of the internal resistance or the like of the rechargeable battery 22 greatly increases and the voltage decrease amount also greatly increases.

In this manner, when the usage environment temperature is in a low temperature range that is less than or equal to T° C., the voltage decrease amount of the rechargeable battery 22 increases. Thus, in this case, during use of the power tool 10 (operation of the motor M), the voltage decrease amount of the rechargeable battery 22 also greatly changes. Accordingly, when the control circuit 16 performs an over-discharge abnormality determination, if the determination value used as a determination reference is fixed, there would be a tendency of an abnormal over-discharge being determined when the usage environment temperature is less than or equal to T° C. This would narrow the operational range of the power tool 10.

Figure 3:
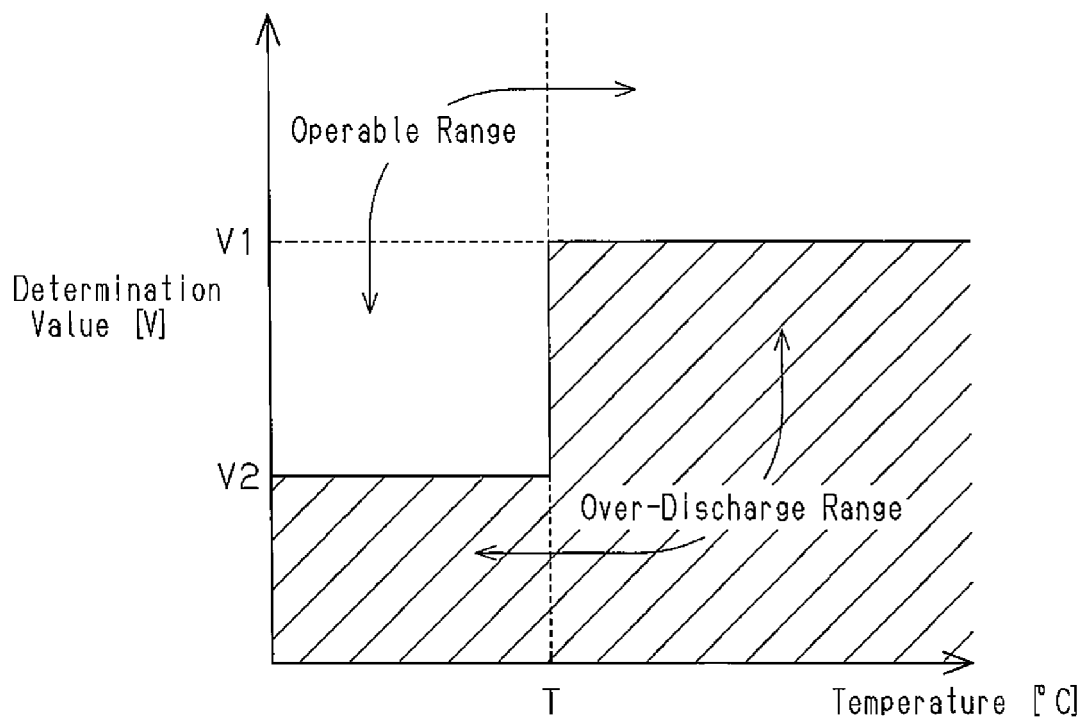
FIG. 3 is a chart illustrating a switch control for a temperature determination value.

Referring to FIG. 3, the control circuit 16 of the present embodiment switches the determination value (determination reference) when performing abnormal over-discharge determinations. In one embodiment, a standard determination value V1 is used when the usage environment temperature is in a range higher than T° C. (e.g., 10° C.), and a determination value V2, which is lower than the standard determination value V1, is used when the usage environment temperature is in a low temperature range that is less than or equal to T° C. (e.g., 10° C.). The standard determination value V1 is set to, for example, 11 V in contrast with the rated voltage of the rechargeable battery 22 that is 14 V. The determination value V2 is set to, for example, 10 V. During use of the power tool 10 (operation of the motor M) in the low temperature range in which the usage environment temperature is T° C. or less, the change amount of the voltage decrease of the rechargeable battery 22 is greatly affected by the temperature. However, in consideration of such a situation, the determination value is changed to the lower determination value V2. This prevents the supply of power to the electric motor M from being stopped. That is, the control for stopping the operation of the power tool 10 is prevented from being implemented at an early stage. As a result, even in the low temperature range in which the usage environment temperature is T° C. or less, a wide operational range may be ensured for the power tool 10.

The control circuit 16 of the present embodiment performs an over-charge abnormality determination in a state immediately before the electric motor M is operated and immediately after the operation switch 12 is operated. That is, the control circuit 16 performs an initial determination of an over-discharge abnormality in a state immediately before the rechargeable battery 22 generates discharge current. In a state immediately before the electric motor M is operated, the rechargeable battery 22 does not generate discharge current. Thus, there is no voltage decrease in the rechargeable battery 22. Here, the control circuit 16 determines an over-discharge abnormality with the determination value V1, which is higher than the determination value V2. In this manner, when there is no temperature-dependent voltage decrease, the determination value V1, which is generally irrelevant to the temperature, is used to accurately perform an over-discharge abnormality determination. During subsequent operation of the motor M, the control circuit 16 performs over-discharge abnormality determination in predetermined cycles.

Figure 4:
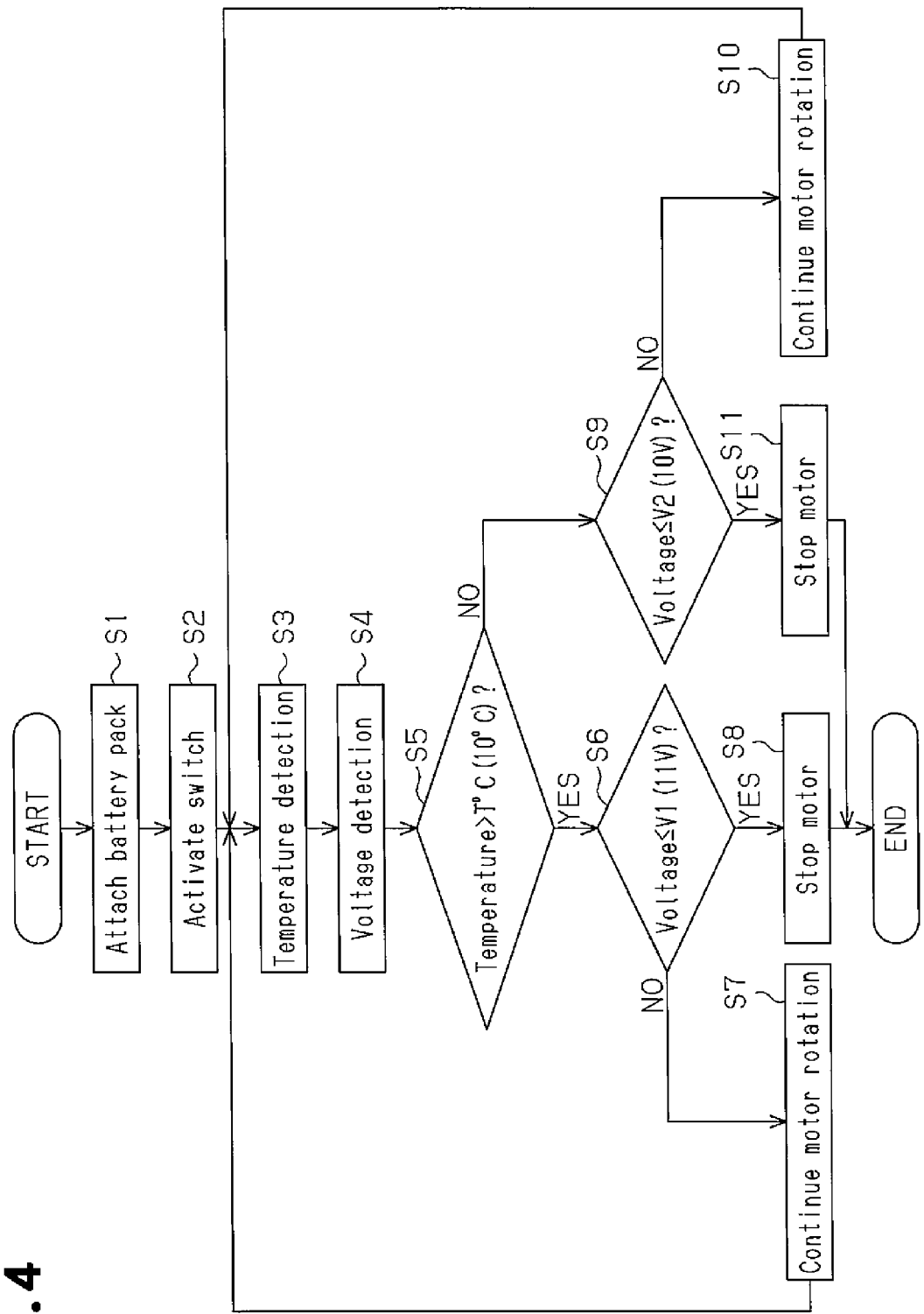
FIG. 4 is a flowchart illustrating a process of a control circuit.

The control circuit 16 of the present invention performs processing in accordance with the flowchart shown in FIG. 4.

In step S1, the attachment state of the battery pack 21 is detected. In step S2, an activation operation of the operation switch 12 is detected. In step S3, the usage environment temperature is detected. In step S4, the voltage of the rechargeable battery 22 is detected.

In step S5, the control circuit 16 determines whether or not the detected temperature is higher than T° C. (e.g., 10° C.). When the temperature is higher than T° C., step S6 is processed. In step S6, the control circuit 16 compares the detected voltage of the rechargeable battery 22 with the determination value V1 (e.g., 11 V) to perform an over-discharge abnormality determination. When the voltage of the rechargeable battery 22 is higher than the determination value V1, that is, when an over-discharge abnormality is not occurring, step S7 is processed. In step S7, the control circuit 16 continues to produce rotation with the electric motor M and continues to operate the power tool 10. In step S6, when the voltage of the rechargeable battery 22 is less than or equal to the determination value V1, that is, when an over-discharge abnormality is occurring, step S8 is processed. In step S8, the control circuit 16 stops supplying power to the electric motor M and stops operating the electric motor M. This stops the operation of the power tool 10.

In step S5, when the value of the temperature is less than or equal to T° C. and in the low temperature range, step S9 is processed. In step S9, the control circuit 16 compares the detected voltage of the rechargeable battery 22 with the determination value V2 (e.g., 10V) to determine an over-discharge abnormality. When the voltage of the rechargeable battery 22 is higher than the determination value V2, that is, when an over-discharge abnormality is not occurring, step S10 is processed. In step S10, the electric motor M continues to produce rotation, and the power tool 10 continues to operate. In step S9, when the voltage of the rechargeable battery 22 is less than or equal to the determination value, that is, when an over-discharge abnormality is occurring, step S11 is processed. In step S11, the supply of power to the electric motor M is stopped to stop the operation of the electric motor M and stop the operation of the power tool 10.

The advantages of the present embodiment will now be described.

(1) The control circuit 16 switches the determination values V1 and V2 in accordance with the usage environment temperature to perform an abnormality determination on the rechargeable battery 22. By using the determination values V1 and V2 in accordance with the usage environment temperature, unnecessary stopping of the electric motor M resulting from changes in the temperature is prevented. Accordingly, the operational range of the power tool 10 is stably obtained. In particular, for the power tool 10 in which the usage environment temperature is apt to changing, there is a great significance to the switching of the determination values.

(2) The control circuit 16 performs an initial over-discharge determination in a state immediately before the electric motor M is operated and immediately after the operation switch 12 is activated (immediately after an activation command). The determination value used for this determination is the standard determination value V1. In a state immediately before the operation switch 12 is activated, the rechargeable battery 22 is not generating discharge current, and a temperature-dependent voltage decrease has not yet occurred. Accordingly, the use of the determination value V1, which is generally irrelevant to the temperature, allows for accurate over-charge determination to be performed.

(3) When the detected usage environment temperature is in the low temperature region, over-charge determination of the rechargeable battery 22 is performed using the determination value V2, which is lower than the determination value V1. As the usage environment temperature decreases, the resistance of the internal resistor or the like of the rechargeable battery 22 increases. This increases the voltage decrease amount. Thus, in the present embodiment that uses the determination value V2 when the usage environment temperature is in the low temperature range, over-charge determination is accurately performed.

(4) The control circuit 16 switches the two determination values V1 and V2 in accordance with the usage environment temperature. This simplifies the process for switching the determination values V1 and V2 and reduces the processing load on the control circuit 16.

The above embodiment may be modified as described below.

The above embodiment uses the two determination values V1 and V2 for the over-discharge determination (abnormality determination) of the rechargeable battery 22. However, three or more determination values may be used. Alternatively, a determination value that varies linearly in accordance with changes in the usage environment temperature may be used.

In the above embodiment, the control circuit 16 determines the voltage of the rechargeable battery 22 based on voltage detection signals from the voltage detection circuits 17 and 23. However, the voltage of the rechargeable battery 22 may be determined with only the detection signal from the voltage detection circuit 23.

In the above embodiment, the temperature detection element 24 in the battery pack 21 detects the usage environment temperature. However, the power tool body 11 may perform the temperature detection.

The above embodiment is applied to the power tool 10, which serves as a motor device. However, the above embodiment may be applied to other motor devices.

The invention claimed is:

1. A motor device comprising:
   an electric motor operated when supplied with power from a rechargeable battery;
   a voltage detection unit that detects voltage of the rechargeable battery;
   a determination unit that performs an abnormality determination based on a comparison of the voltage of the rechargeable battery, which is detected by the voltage detection unit, and a determination value;
   a control unit that controls the operation of the electric motor in accordance with the determination result of the determination unit; and
   a temperature detection unit that detects the usage environment temperature,
   wherein the determination unit changes the determination value in accordance with the temperature detected by the temperature detection unit and performs the abnormality determination based on the changed determination value, and
   wherein the determination unit performs an initial abnormality determination in a state immediately before the electric motor is operated immediately after an activation command, and the determination unit uses, for the initial abnormality determination, a standard determination value as the determination value before the determination value is changed.

2. The motor device according to claim 1, wherein when the temperature detected by the temperature detection unit is low, the determination unit decreases the determination value and performs the abnormality determination.

3. The motor device according to claim 2, wherein the determination unit switches between two determination values and performs the abnormality determination.

4. The motor device according to claim 1, wherein the determination unit switches between two determination values and performs the abnormality determination.

5. A power tool comprising the motor device according to claim 1.

6. A motor device comprising:
   an electric motor operated when supplied with power from a rechargeable battery;
   a voltage detection unit that detects voltage of the rechargeable battery;
   a determination unit that performs an abnormality determination based on a comparison of the voltage of the rechargeable battery, which is detected by the voltage detection unit, and a determination value;

a control unit that controls the operation of the electric motor in accordance with the determination result of the determination unit; and a temperature detection unit that detects the usage environment temperature, wherein the determination unit changes the determination value in accordance with the temperature detected by the temperature detection unit and performs the abnormality determination based on the changed determination value, and wherein when the temperature detected by the temperature detection unit is low, the determination unit decreases the determination value and performs the abnormality determination.

7. The motor device according to claim 6, wherein the determination unit switches between two determination values and performs the abnormality determination.

8. A power tool comprising the motor device according to claim 6.

* * * * *